(12) United States Patent
Takahashi

(10) Patent No.: US 7,160,393 B2
(45) Date of Patent: Jan. 9, 2007

(54) VACUUM CHAMBER ASSEMBLY

(75) Inventor: Nobuyuki Takahashi, Sagamihara (JP)

(73) Assignee: CYG Corporation, Kanagawa (JP)

( * ) Notice: Subject to any disclaimer, the term of this patent is extended or adjusted under 35 U.S.C. 154(b) by 287 days.

(21) Appl. No.: 10/807,275

(22) Filed: Mar. 24, 2004

(65) Prior Publication Data
US 2004/0187781 A1 Sep. 30, 2004

(30) Foreign Application Priority Data
Mar. 26, 2003 (JP) ............................. 2003-085251

(51) Int. Cl.
*C23C 16/00* (2006.01)
*F16J 15/02* (2006.01)

(52) U.S. Cl. .................. 118/733; 118/50; 277/312; 277/630; 277/637; 220/677; 220/680; 220/681; 49/475.1; 49/479.1

(58) Field of Classification Search ............... 118/715, 118/50, 733; 277/312, 315, 316, 630, 637, 277/905, 921; 220/680, 681, 361, 677; 49/479.1, 49/498.1, 475.1
See application file for complete search history.

(56) References Cited

U.S. PATENT DOCUMENTS

| | | | | |
|---|---|---|---|---|
| 3,741,886 A | * | 6/1973 | Urbanek et al. | 204/298.12 |
| 4,422,915 A | * | 12/1983 | Wielonski et al. | 204/165 |
| 4,790,921 A | * | 12/1988 | Bloomquist et al. | 204/192.12 |
| 5,551,706 A | * | 9/1996 | Barna et al. | 277/312 |
| 5,653,447 A | * | 8/1997 | Cress | 277/312 |
| 5,673,167 A | * | 9/1997 | Davenport et al. | 361/234 |
| 5,676,757 A | * | 10/1997 | Ikeda et al. | 118/733 |
| 5,853,176 A | * | 12/1998 | Kiriyama | 277/312 |
| 5,934,686 A | * | 8/1999 | Ottenschlager | 277/591 |
| 6,010,133 A | * | 1/2000 | Boyd et al. | 277/312 |
| 2004/0187781 A1 | * | 9/2004 | Takahashi | 118/715 |
| 2005/0183824 A1 | * | 8/2005 | Lee et al. | 156/345.31 |

FOREIGN PATENT DOCUMENTS

JP     02-122824 A   *  5/1990

* cited by examiner

*Primary Examiner*—Jeffrie R. Lund
(74) *Attorney, Agent, or Firm*—Wenderoth, Lind & Ponack, L.L.P.

(57) ABSTRACT

A vacuum chamber assembly comprises a floor plate, an upper plate, plural props standing on the floor plate to support the upper plate, and side plates closing side opening portions between the props. First connected portions between the floor plate and the props and second connected portions between the upper plate and the props are fixed by screws. Circumferential edge portions of the side opening portions are provided with installation grooves, respectively. A gasket includes side surface sealing portions installed in the installation grooves formed on the circumferential edge portions of the side opening portions, respectively, and connection sealing portions for sealing the first connected portions and the second connected portions. The side plates are fixed to the circumferential edge portions to close the side opening portions via the side surface sealing portions of the gasket, respectively.

16 Claims, 7 Drawing Sheets

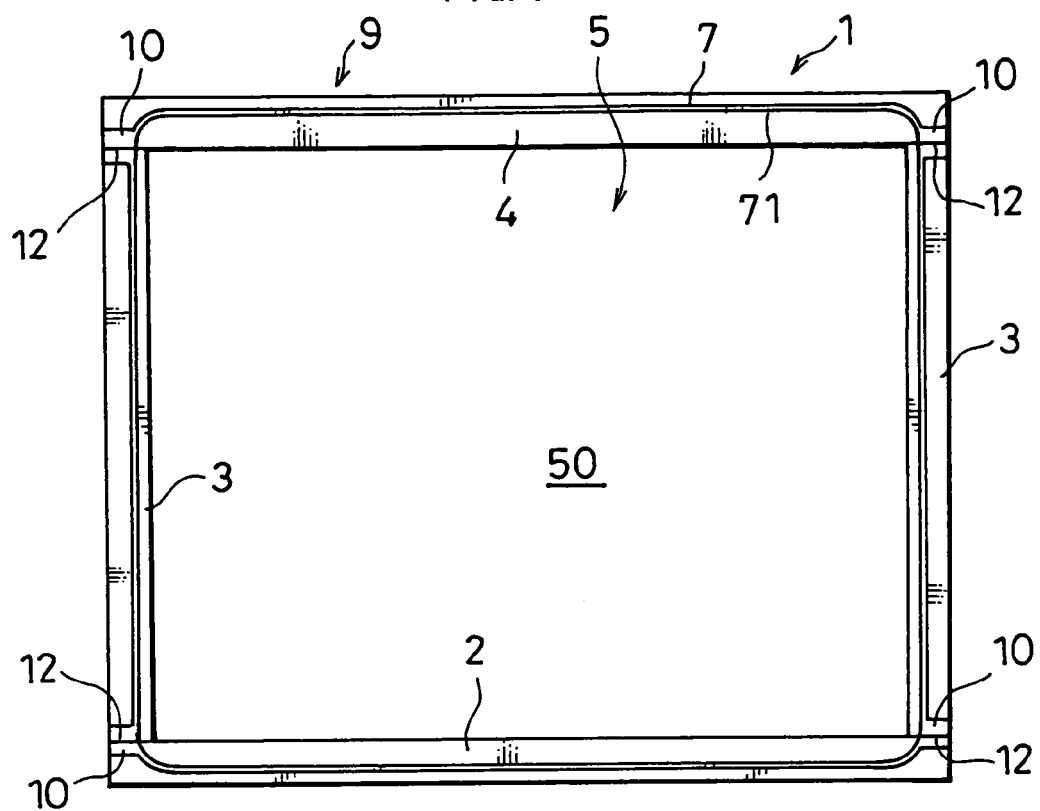
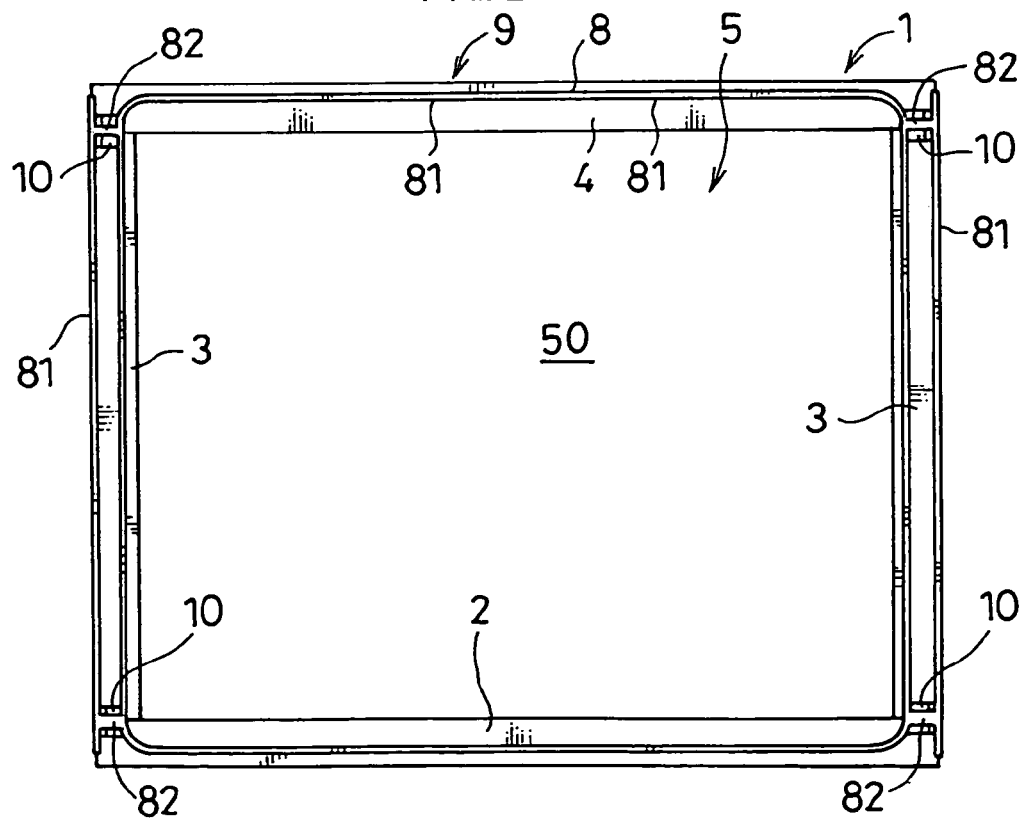

VACUUM CHAMBER ASSEMBLY

BACKGROUND OF THE INVENTION

This invention relates to a vacuum chamber assembly constituting a part of a device such as a sputtering device, a dry-etching device, a CVD device, a vacuum furnace, etc., used in manufacturing such as semiconductor manufacturing, flat-panel manufacturing, and so on.

JP11-50229A discloses a vacuum chamber which can be used in a semiconductor manufacturing system, in which a time for evacuating air after changing consumption articles or after regular maintenance can be decreased.

In the vacuum chamber, joint portions are joined by means of welding, soldering, etc, deformation due to the joint work are removed, and further, a cutting operation or a grinding operation is carried out in order to increase an airtight level. Furthermore, it is necessary to carry out a cleaning operation in order to remove contaminations such as swarf, flux, etc. coming out of the cutting operation or the grinding operation.

Besides, as shown in JP-1-50229A, the vacuum chamber constitutes a part of a device such as a sputtering device, a dry-etching device, a CVD device, or a vacuum furnace. However, up to now, a method, in which the device including the vacuum chamber is assembled in a factory, and then transported and arranged to a specific place, was carried out in order to maintain an airtight level of the vacuum chamber.

However, since the vacuum chamber becomes larger as the device becomes larger, it becomes difficult to transport and arrange the device after assembling it in the factory, so that it becomes necessary, for example, to assemble the device at a worksite such as a factory. As a result, though it is desired to assemble the vacuum chamber on the spot, it is difficult to repair the deformation due to the work in a case in which the vacuum chamber is assembled by means of welding or soldering on the spot, so that problems are caused in the airtight level of the vacuum chamber, and also cleaning of contaminations such as swarf, flux, etc. is very difficult. In the case of desiring extension, the extension must be given up because it is difficult to carry the device into the spot.

SUMMARY OF THE INVENTION

The object of the invention is to provide a vacuum chamber assembly which can be assembled on a spot such as a factory easily and extension of which is easy.

This invention is a vacuum chamber assembly which constitutes a part of a device such as a sputtering device, comprising at least a floor plate, an upper plate, a plurality of props standing on the floor plate to support the upper plate, and side plates for closing side opening portions between the props. First connected portions between the floor plate and the props and second connected portions between the upper plate and the props are fixed by screw fixing members. Side surfaces of the floor plate, the props and the upper plate which constitutes circumferential edge portions of the side opening portions are provided with installation grooves, respectively. A gasket is unitedly constituted of side surface sealing portions installed in the installation grooves formed on the circumferential edge portions of the side opening portions, respectively, and connection sealing portions for sealing the first connected portions and the second connected portions. The side plates are fixed to the circumferential edge portions so as to close the side opening portions via the side surface sealing portions of the gasket, respectively.

Furthermore, it is preferred that projections projecting along borderlines of the first connected portions and the second connected portions are formed, respectively, and sealing grooves for engaging the projections are formed in the connection sealing portions of the gasket, respectively.

Moreover, it is preferred that housing spaces, for housing top portions of the gasket which is pressed by the side plates, are formed along side lines of the installation grooves in the installation grooves, respectively. The housing spaces can be formed along one of the side lines of the installation grooves or along both side lines of the installation grooves.

Furthermore, it is desired that the first connected portions and the second connected portions have housing grooves for the connection sealing portions of the gasket which are formed in an arc shape along respective connected portions, and the projections are formed so as to project into the housing grooves. Besides, it is desired that the housing grooves are formed in a size such as to be able to house top portions of the connection sealing portions of the gasket which are pressed and deformed by the side plates.

Moreover, the side plates are provided with at least equipment for windows, equipment for intake or discharge piping, wiring harness equipment, etc.

BRIEF DESCRIPTION OF THE DRAWINGS

FIG. 1 is an explanatory diagram of a framework of a vacuum chamber assembly according to a working mode of the present invention;

FIG. 2 is an explanatory diagram showing a condition in which a gasket is installed to the framework of the vacuum chamber assembly according to a working mode of the present invention;

PREFERRED EMBODIMENT OF THE INVENTION

Figure 3:
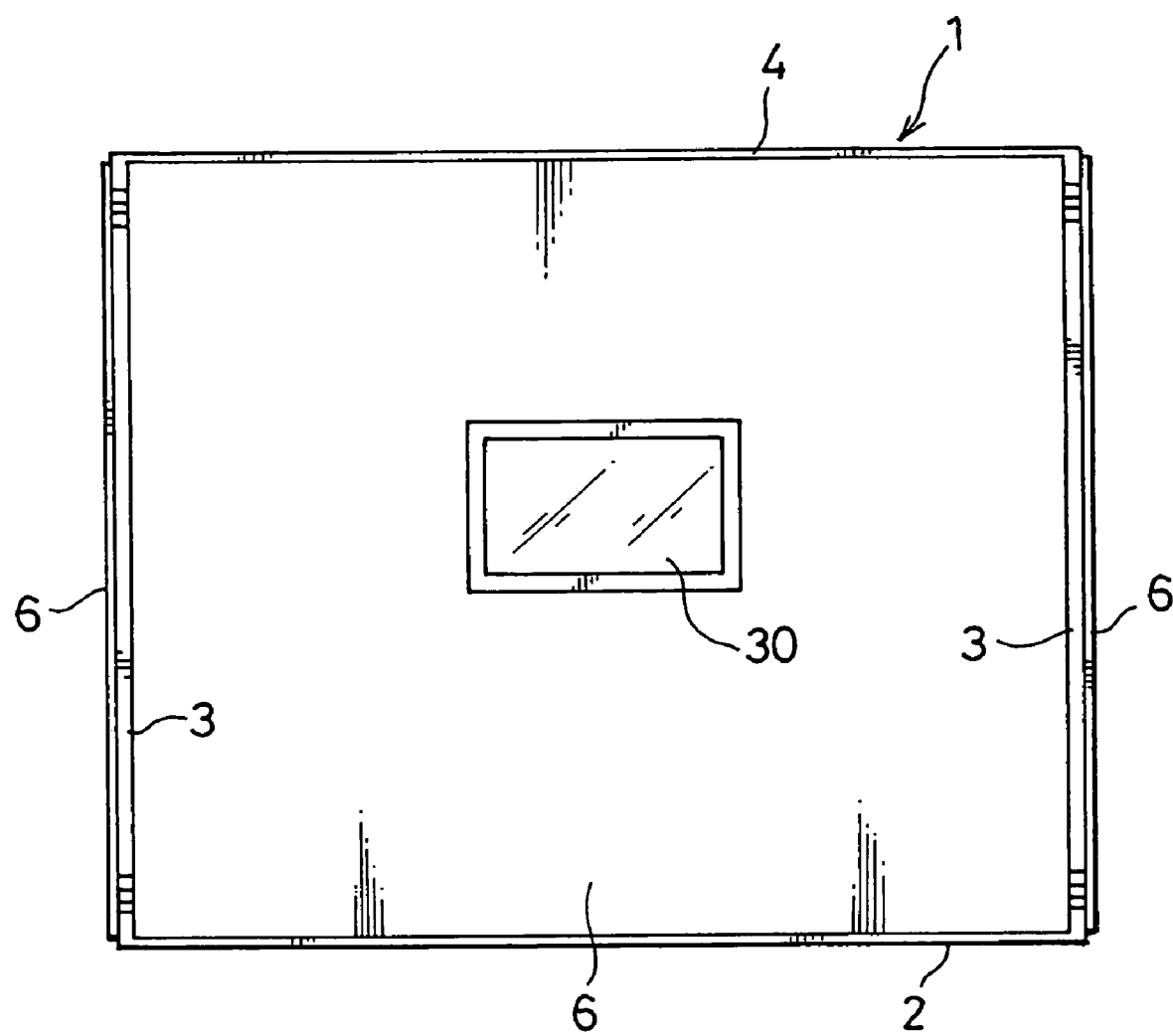
FIG. 3 is an explanatory diagram showing a condition in which the vacuum chamber assembly according to the working mode of the present invention is completed.

Hereinafter, a working mode of this invention is explained by referring to the drawings.

A vacuum chamber assembly 1 according to the present invention constitutes a part of a device such as a sputtering device, dry-etching device, a CVD device, a vacuum furnace, etc. for instance, a sputtering mechanism comprising a substrate, a target, etc., is located inside thereof, and a pump for vacuuming, a control unit, etc., are provided outside thereof, so that a sputtering device is constituted as a whole (not shown in drawings).

Firstly, in the vacuum chamber assembly 1, as shown in FIG. 1, a framework 9 is constituted of a floor plate 2 on which the device is installed, a plurality of (four in this working mode) props 3 standing on the floor plate 2 and an upper plate 4 supported by the props 4 so as to surround a space 50 in which the device is located.

Figure 4:
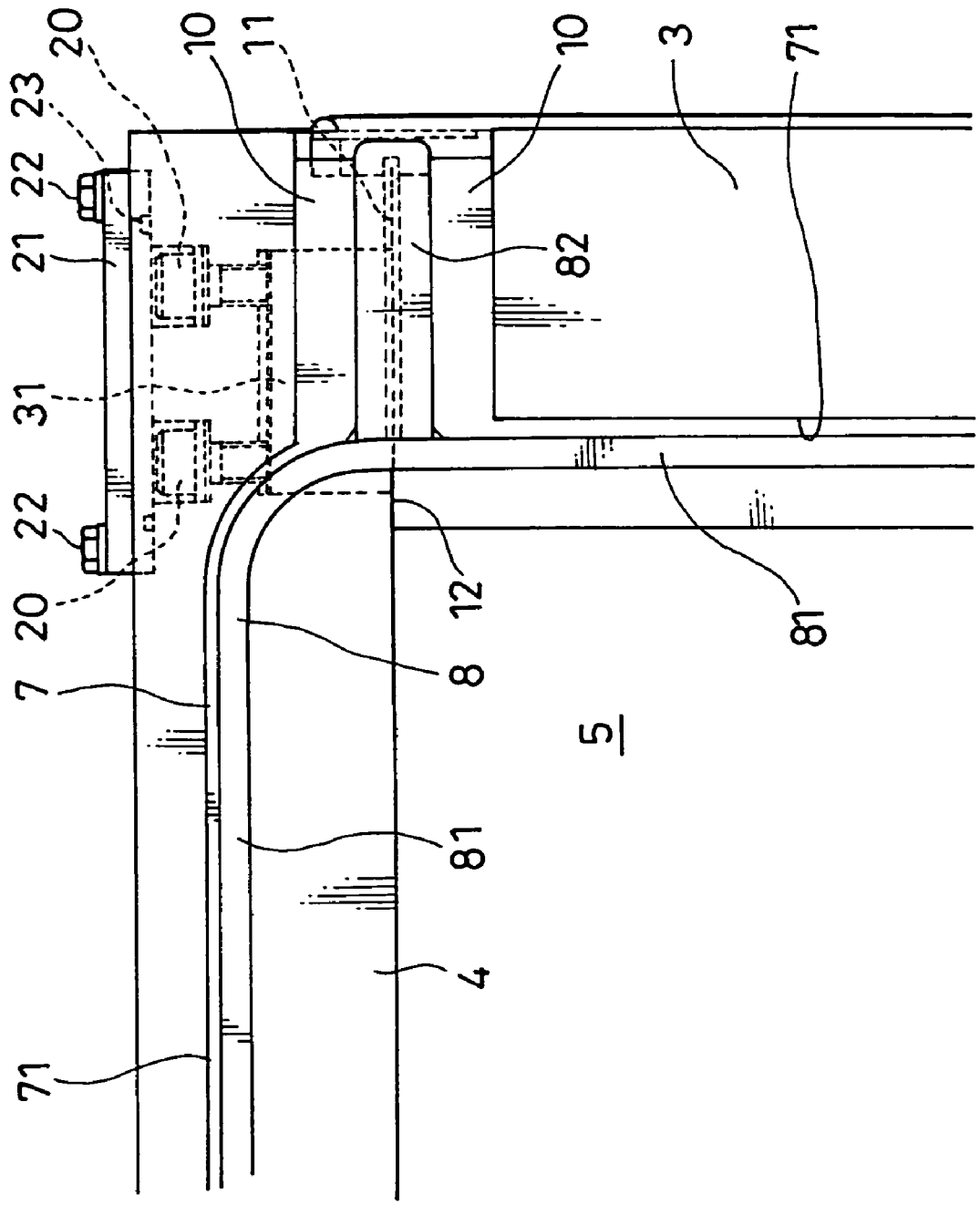
FIG. 4 is a partial enlarged explanatory diagram of a connected portion which is between a floor plate and one of props or between one of props and an upper plate.

It is desired that assembling the framework 9, as shown in FIG. 4, is carried out by projecting portions 31 formed at ends of props 3 being engaged into concave portions formed in the upper plate 4, respectively, and the props 3 and the upper plate 4 being fixed together by a fixing means such as bolts and screws 20. Also, connection between the floor plate 2 and props 3 are fixed in the same way.

Besides, as shown in FIG. 1, an installation portion 7 in which a gasket 8 is installed is formed on the framework 9. This installation portion 7 is constituted of installation grooves 71 that are formed on side surfaces of the floor plate 2, the props 3 and the upper plate 4 which constitute circumferential edges of openings 5 formed between props 3 respectively, and arc-shaped housing grooves 10 formed along borderlines of connected portions 12 which consist of first connected portions between the floor plates 2 and the props 3 and second connected portions between the props 3 and the upper plate 4, respectively, wherein the installation grooves are connected via the housing grooves 10, respectively.

Figure 6:
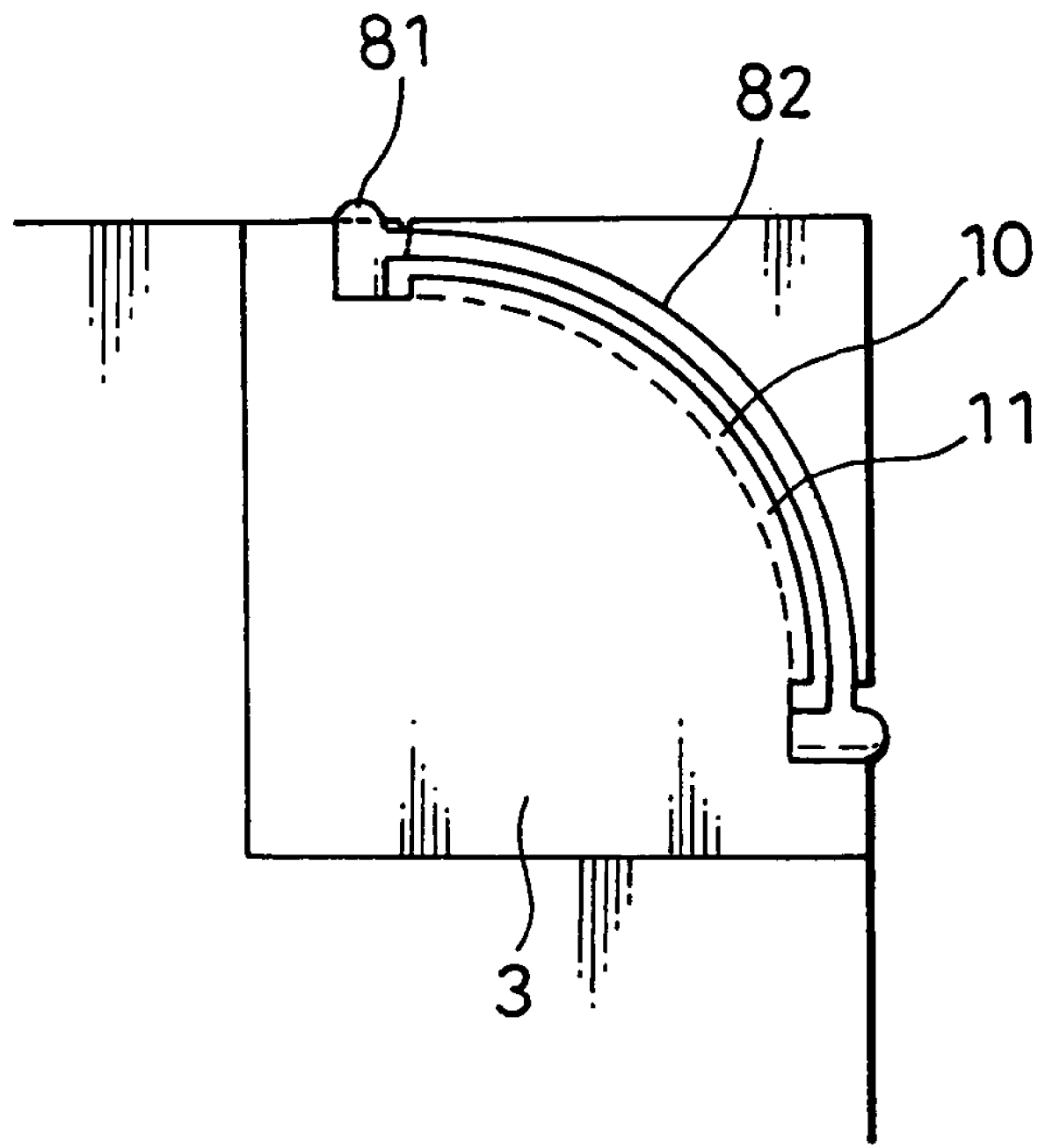
FIG. 6 is a partial cross section of the prop.

Then, as shown in FIG. 2, the gasket 8 is installed in the installation portion 7. The gasket 8 is unitedly constituted of side surface sealing portions 81 which are installed into the installation grooves 71 formed in the circumferential edges of the side opening portions 5, respectively, and connection sealing portions 82 fitting into the connected portions respectively as shown in FIG. 6.

As shown in FIG. 3, the vacuum chamber assembly 1 is assembled by fixing the side plates 6 for closing the side opening portions 5 to the framework 9 in which the gasket 8 is installed so as to press the gasket 8.

Besides, a peephole 30 as shown in FIG. 3 is formed in the side plate 6, and further, a piping mechanism for intake and discharge and a wiring harness mechanism between a control unit and a sputtering device located inside thereof are provided (not shown in Figures).

Figure 7:
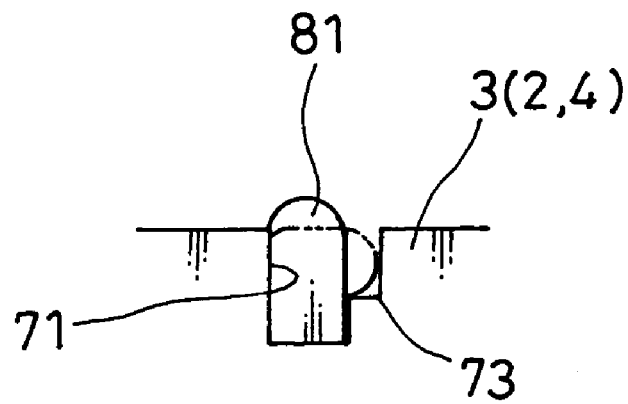
FIG. 7 is a partial cross section of a side sealing portion of the gasket and an installation groove.

Furthermore, the respective side surface sealing portions 81 of the gasket 8 are, as shown in FIG. 7, an approximate square in their cross section so as to engage in the installation grooves 71, so that top portions of it are deformed when the side plates 6 press them to crush into housing spaces 73 along side lines of the installation grooves. Thus, contacting faces between the top portions of the side surface sealing portions 81 and the side plates 6, respectively, are increased, so that a sealing level of these portions can be increased.

Figure 8:
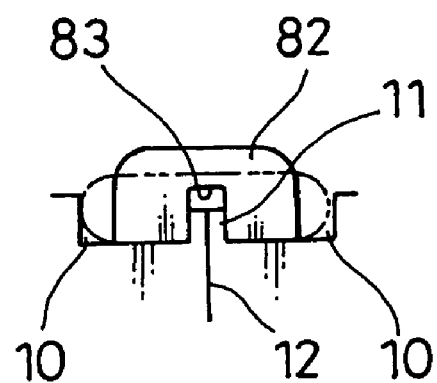
FIG. 8 is a partial cross section of a connection sealing portion of the gasket and a connected portion.

Moreover, as shown in FIGS. 4 and 8, parts of the housing grooves 10 in the connected portions 12 are provided with projections 11 projecting along contacted surfaces, respectively, and further the connection sealing portions 82 are provided so as to cover the projections 11 respectively. Concretely, housing concave portions 83 for housing the projections 11 are formed inside the connection sealing portions 82, so that the sealing level in these portions can be increased because the projections 11 are engaged in the housing concave portions 83.

Figure 5:
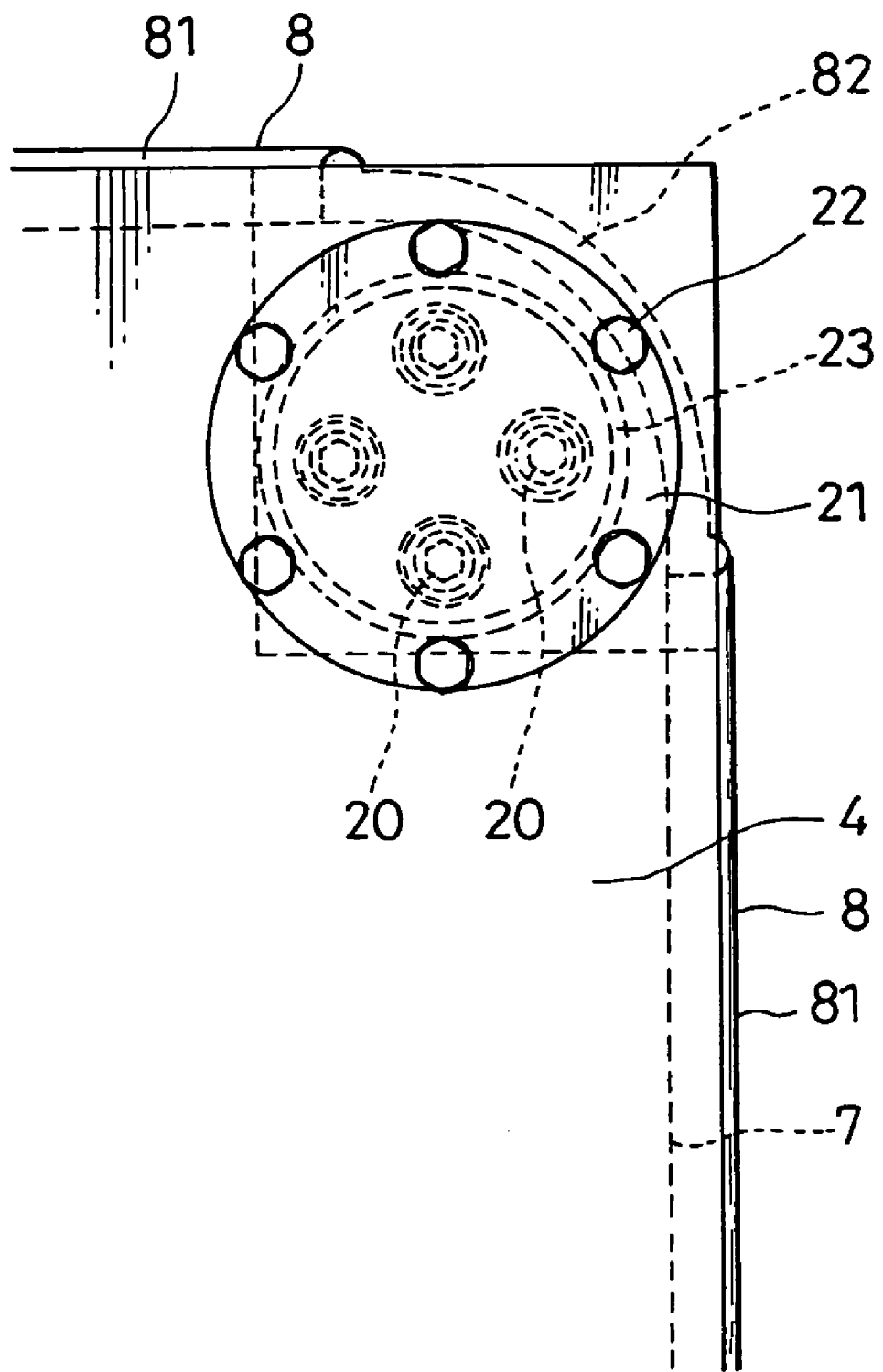
FIG. 5 is a partial enlarged plan view of the connected portion.

Besides, as shown in FIGS. 4 and 5, in fixing portions for fixing between the props 3 and the upper plate 4 or between the props 3 and the floor plate 2, leakage from the fixing portions can be prevented by arranging ring-shaped sealing members (such as O-rings) 23 around the fixing screws 20, respectively, covering the fixing portions by cover portions 21, and fixing the cover portions 21 by screws 22.

With this arrangement, it is possible to assemble the vacuum chamber on a spot such as a factory. Furthermore, since thermal deformation of plates and props are prevented because heat in welding or soldering, etc. is not yielded on the spot, so that a grinding operation or a cleaning operation can be omitted on the spot.

Figure 9:
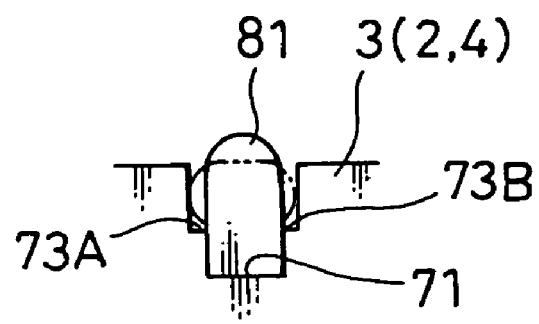
FIG. 9 is a partial cross section of another working mode of a side sealing portion of the gasket and an installation groove.

A working mode as shown in FIG. 9 is such that housing spaces 73 for housing deformation of the top portions of the side surface sealing portions 81 are formed along both side lines of the installation grooves 71. Since housing spaces 73A and 73B are provided on the both sides of the housing spaces 73, the side surface sealing portions 81 are crushed into the housing spaces 73A and 73B equally to be housed, such that bias of the gasket 8 can be prevented.

Figure 10:
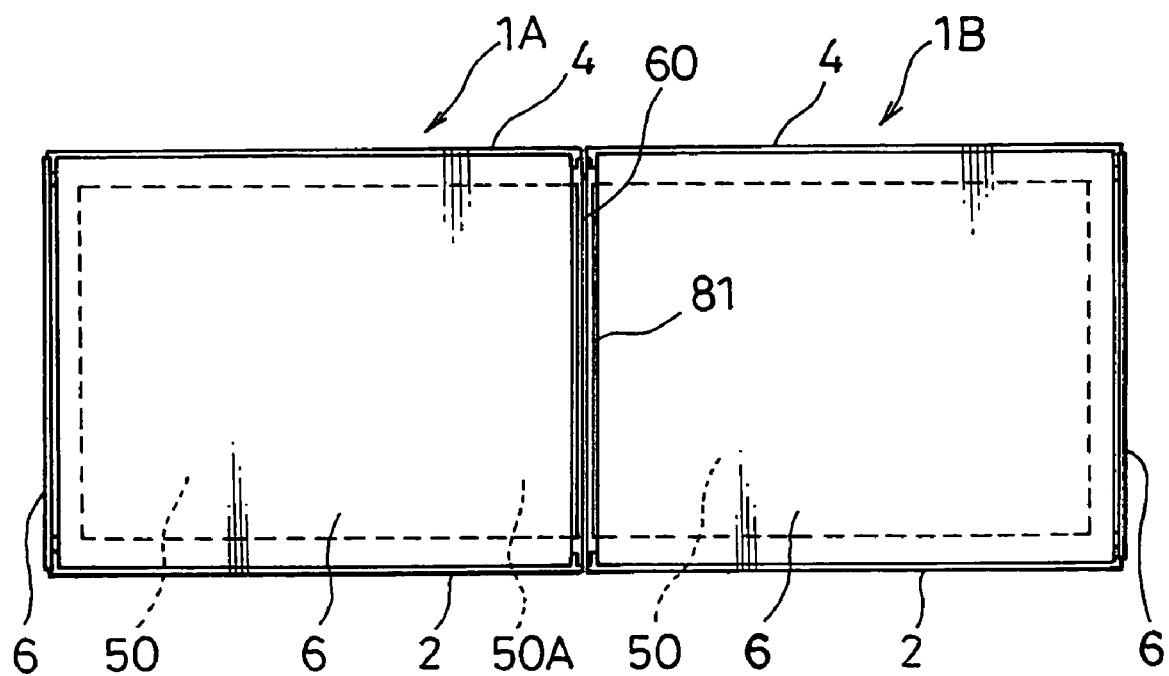
FIG. 10 is an explanatory diagram showing a condition in which the vacuum chamber assemblies are provided in series.

Moreover, as shown in FIG. 10, a vacuum chamber assembly 1 (1A) with the above-mentioned constitution is connected with the same vacuum chamber assembly 1B by removing one of the side plates 6, disposing the vacuum chamber assembly 1A adjacent to the vacuum chamber assembly 1B, and fixing them to each other to be able to gain an inner space 50A larger than an inner space 50 in one vacuum chamber assembly. Besides, a frame with the same shape as the circumferential edge of an opening portion, created by removing the side plate 6, is arranged between the vacuum chamber assemblies 1A and 1B, it is preferred to connect both assemblies 1A and 1B via the frame. Thus, since a plurality of vacuum chamber assemblies 1 can be connected in series, the vacuum chamber assembly 1 is adaptable upon extension of equipment in future.

As explained above, according to this invention, it is easy to transport parts to a working spot and it is possible to assemble it on the spot, because the vacuum chamber assembly is a system assembled by screws and so on. Furthermore, since a heating operation such as welding or soldering which was carried out on the spot before is not carried out, additional treatment to heat deformation etc. and/or cleaning operation can be omitted. For these reasons, enlarging of a device itself can be coped with, simplifying of transport operation and simplifying of assembling operation can be achieved, and further, reducing costs reduction can be achieved.

Since the gasket which is formed unitedly of parts for sealing the side surfaces and parts for sealing the connected portions are used, a sealing level in the connected portions can be increased, and further, the sealing level in the connected portions can be made reliable with the constitution in which the connected portions are covered.

Furthermore, the assembly can be extended easily without decreasing the sealing level.

What is claimed is:

1. A vacuum chamber assembly comprises a floor plate; an upper plate; a plurality of props standing on said floor plate to support said upper plate; side plates for closing side opening portions between said props;
   first connected portions fixed between said floor plate and said props by screw fixing members, and second connected portions fixed between said upper plate and said props by screw fixing members;
   wherein side surfaces of said floor plate, said props and said upper plate which constitute circumferential edge portions of said side opening portions are provided with installation grooves, respectively;
   wherein a gasket is provided and is unitedly constituted of side surface sealing portions installed in said installation grooves formed on said circumferential edge portions of said side opening portions, respectively, and connection sealing portions for sealing said first connected portions and said second connected portions;

wherein said side plates are fixed to said circumferential edge portions so as to close said side opening portions via said side surface sealing portions of said gasket, respectively; and wherein projections projecting along borderlines of said first connected portions and said second connected portions are respectively formed, and sealing grooves for engaging said projections are respectively formed in said connection sealing portions of said gasket.

2. A vacuum chamber assembly according to claim 1, wherein said installation grooves include housing spaces along side lines thereof, respectively, for housing deformed top portions of said gasket, respectively, said top portions of said gasket being deformed by pressing of said side plates.

3. A vacuum chamber assembly according to claim 2, wherein said housing spaces are formed along one of opposing side lines of each of said installation grooves.

4. A vacuum chamber assembly according to claim 3, wherein said first connected portions and said second connected portions have housing grooves for said connection sealing portions of said gasket which are formed in an arc shape along said first and second connected portions, and wherein projections are formed so as to project into said housing grooves.

5. A vacuum chamber assembly according to claim 4, wherein said housing grooves are formed in a size such as to be able to house top portions of said connection sealing portions of said gasket which are deformed by pressing of said side plates.

6. A vacuum chamber assembly according to claim 5, wherein said side plates are provided with at least one of equipment for windows, equipment for intake or discharge piping, and wiring harness equipment.

7. A vacuum chamber assembly according to claim 2, wherein said housing spaces are formed along both side lines of said installation grooves.

8. A vacuum chamber assembly according to claim 7, wherein said first connected portions and said second connected portions have housing grooves for said connection sealing portions of said gasket which are formed in an arc shape along said first and second connected portions, and wherein projections are formed so as to project into said housing grooves.

9. A vacuum chamber assembly according to claim 8, wherein said housing grooves are formed in a size such as to be able to house top portions of said connection sealing portions of said gasket which are deformed by pressing of said side plates.

10. A vacuum chamber assembly according to claim 9, wherein said side plates are provided with at least one of equipment for windows, equipment for intake or discharge piping, and wiring harness equipment.

11. A vacuum chamber assembly according to claim 2, wherein said first connected portions and said second connected portions have housing grooves for said connection sealing portions of said gasket which are formed in an arc shape along said first and second connected portions, and wherein projections are formed so as to project into said housing grooves.

12. A vacuum chamber assembly according to claim 11, wherein said housing grooves are formed in a size such as to be able to house top portions of said connection sealing portions of said gasket which are deformed by pressing of said side plates.

13. A vacuum chamber assembly according to claim 1, wherein said first connected portions and said second connected portions have housing grooves for said connection sealing portions of said gasket which are formed in an arc shape along said first and second connected portions, and said projections are formed so as to project into said housing grooves.

14. A vacuum chamber assembly according to claim 13, wherein said housing grooves are formed in a size such as to be able to house top portions of said connection sealing portions of said gasket which are deformed by pressing of said side plates.

15. A vacuum chamber assembly comprises a floor plate; an upper plate; a plurality of props standing on said floor plate to support said upper plate; side plates for closing side opening portions between said props;

first connected portions fixed between said floor plate and said props by screw fixing members, and second connected portions fixed between said upper plate and said props by screw fixing members;

wherein side surfaces of said floor plate, said props and said upper plate which constitute circumferential edge portions of said side opening portions are provided with installation grooves, respectively;

wherein a gasket is provided and is unitedly constituted of side surface sealing portions installed in said installation grooves formed on said circumferential edge portions of said side opening portions, respectively, and connection sealing portions for sealing said first connected portions and said second connected portions;

wherein said side plates are fixed to said circumferential edge portions so as to close said side opening portions via said side surface sealing portions of said gasket, respectively; and wherein said first connected portions and said second connected portions have housing grooves for said connection sealing portions of said gasket which are formed in an arc shape along said first and second connected portions, and wherein projections are formed so as to project into said housing grooves.

16. A vacuum chamber assembly according to claim 15, wherein said housing grooves are formed in a size such as to be able to house top portions of said connection sealing portions of said gasket which are deformed by pressing of said side plates.

* * * * *